United States Patent
Hamada

(10) Patent No.: US 6,720,524 B1
(45) Date of Patent: Apr. 13, 2004

(54) METHOD AND APPARATUS FOR LASER DRILLING

(75) Inventor: Shiro Hamada, Hiratsuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 13 days.

(21) Appl. No.: 10/089,063

(22) PCT Filed: Oct. 3, 2000

(86) PCT No.: PCT/JP00/06878

§ 371 (c)(1), (2), (4) Date: Apr. 5, 2002

(87) PCT Pub. No.: WO01/24964

PCT Pub. Date: Apr. 12, 2001

(30) Foreign Application Priority Data

Oct. 7, 1999 (JP) .......................................... 11/286304

(51) Int. Cl.[7] .............................................. B23K 26/00
(52) U.S. Cl. ................................ 219/121.7; 219/121.71
(58) Field of Search .................. 219/121.7, 121.71, 219/121.72, 121.74, 121.75, 121.85

(56) References Cited

U.S. PATENT DOCUMENTS

| | | | | |
|---|---|---|---|---|
| 4,378,480 A | * | 3/1983 | Langhans ............ | 219/121 LK |
| 5,403,990 A | * | 4/1995 | Fukuchi ................... | 219/121.7 |
| 5,587,094 A | * | 12/1996 | Yoshida et al. ........ | 219/121.68 |
| 5,670,069 A | * | 9/1997 | Nakai et al. ........... | 219/121.73 |
| 5,837,962 A | * | 11/1998 | Overbeck .............. | 219/121.68 |
| 5,939,010 A | * | 8/1999 | Yuyama et al. ............. | 264/400 |
| 5,948,200 A | * | 9/1999 | Nakazawa et al. | |
| 6,090,330 A | * | 7/2000 | Gawa et al. ................ | 264/400 |
| 6,220,058 B1 | * | 4/2001 | Koyama et al. .............. | 65/392 |

FOREIGN PATENT DOCUMENTS

| | | |
|---|---|---|
| JP | 52-108598 | 9/1977 |
| JP | 4-41259 | 2/1992 |
| JP | 5-42379 | 2/1993 |
| JP | 7-32183 | 2/1995 |
| JP | 8-150485 | 6/1996 |
| JP | 9-94683 | 4/1997 |
| JP | 10-58178 | 3/1998 |

* cited by examiner

Primary Examiner—M. Alexandra Elve
(74) Attorney, Agent, or Firm—Squire, Sanders & Dempsey L.L.P.

(57) ABSTRACT

A polygon mirror 11, a mask 12 having a row of holes for defining a processing pattern, a galvano-mirror 16, and a processing lens 17 are arranged in that order between a laser oscillator 10 and a printed circuit board 20 as a workpiece, and the laser beam from the laser oscillator 10 is projected onto the printer circuit board 20 traveling through these components. The polygon mirror 11 sweeps the laser beam so that the laser beam scans the holes of the mask 12 for the mirror on each face, and a plurality of holes are thereby formed into the printed circuit board 20. The irradiation region of the laser beam to the printer circuit board 20 is shifted in one axis direction by the galvano-mirror 16.

10 Claims, 9 Drawing Sheets

METHOD AND APPARATUS FOR LASER DRILLING

TECHNICAL FIELD

The present invention relates to a laser drilling method and a laser drilling apparatus for carrying out drilling by irradiating works such as printed circuit boards and ceramic substrates with a laser beam from a laser oscillator.

BACKGROUND ART

With trends toward miniaturization and high-density mounting of electronic components, high density is required for printed circuit boards. For example, an interposer is known as a printed circuit board for mounting and packaging LSI chips. Although connection between such LSI chips and the interposer has been primarily performed by wire bonding processes, flip-chip mounting is increasing and furthermore, the number of pins in packages is increasing. With such trends, holes which are called via holes must be provided in small diameters and in fine pitches in the interposer.

Although such drilling has been performed by a mechanical machining process using a fine mechanical drill or by an exposure (photo-via) process, laser beams start to be used nowadays. Drilling apparatuses using laser beams are superior to mechanical machining using fine drills in view of processing rate and ready formation of finer holes. As laser beam sources, $CO_2$ lasers and harmonic solid-state lasers are generally used because of the inexpensiveness of the laser oscillator and reduced running costs.

Problems to be Solved by the Invention

In the conventional laser drilling apparatus, the laser beam from the laser oscillator is introduced to an optical scanning system having biaxial galvano-mirrors called an X-Y scanner or galvano-scanner via an optical path including a reflecting mirror and the like. The drilling is carried out by scanning the laser beam by the optical scanning system and by irradiating a printed circuit board with the laser beam through a processing lens (for example, Japanese Unexamined Patent Publication No. Tokkai-Hei 10-58178). Since the positions of holes to be formed in the printed circuit board are determined preliminarily, the drilling is carried out one by one by controlling the optical scanning system in accordance with the information of the positions of these holes.

However, in the one-by-one drilling using the optical scanning system having the X-Y scanner or galvano-scanner, the processing time increases in proportion to the increment of the number of the holes in the printed circuit board. By the way, since the response of the galvano-scanner is about 500 pps, it is difficult to form 500 or more holes per second. Supposing that holes with a diameter of 50 $\mu$m are arranged at a pitch of 0.2 mm in a square package board with a side length of 10 mm, the number of the holes is 2,500. In this case, the processing time is required by 2,500/500=5 sec, even if the drilling with a drilling rate of 500 holes/sec is carried out.

Accordingly, an object of the present invention is to provide a laser drilling method that can form many holes within a shorter time compared with known laser drilling methods.

Another object of the present invention is to provide a laser drilling apparatus suitable for the above method.

DISCLOSURE OF INVENTION

The present invention is a laser drilling method for carrying out drilling by irradiating a workpiece with a laser beam from a laser oscillator. According to an aspect of the present invention, in the drilling method, the laser beam is projected traveling through a polygon mirror, a mask having a mask pattern including a plurality of holes for defining a processing pattern, at least one galvano-mirror, and a processing lens. The polygon mirror sweeps the laser beam so that the laser beam scans across the plurality of holes in the mask to thereby forming a plurality of holes into the workpiece. An irradiation region of the laser beam onto the workpiece is shifted in one axis direction by the at least one galvano-mirror.

In a laser drilling method according to another aspect of the present invention, the laser beam is projected traveling through a shaping optical system for shaping the laser beam into a line or rectangle, a polygon mirror, a mask having a mask pattern including a plurality of holes for defining a processing pattern, at least one galvano-mirror, and a processing lens. The polygon mirror sweeps the laser beam so that the laser beam scans across the plurality of holes in the mask to thereby collectively forming a plurality of holes into the workpiece. An irradiation region of the laser beam is shifted in one axis direction by the at least one galvano-mirror.

According to the present invention, a laser drilling apparatus for carrying out drilling by irradiating a workpiece with a laser beam from a laser oscillator is provided. In the drilling apparatus, a polygon mirror, a mask having a mask pattern including a plurality of holes for defining a processing pattern, at least one galvano-mirror, and a processing lens are arranged between the laser oscillator and the workpiece. The laser beam from the laser oscillator is projected onto the workpiece traveling through these components. The polygon mirror sweeps the laser beam so that the laser beam scans across the plurality of holes in the mask to thereby forming a plurality of holes into the workpiece. An irradiation region of the laser beam is shifted in one axis direction by the at least one galvano-mirror.

In a laser drilling apparatus according to another aspect of the present invention, a shaping optical system for shaping the laser beam into a line or rectangle, a polygon mirror, a mask having a mask pattern including a plurality of holes for defining a processing pattern, at least one galvano-mirror, and a processing lens are arranged between the laser oscillator and the workpiece.

In any above-mentioned laser drilling apparatus, in case of providing two galvano-mirrors, the irradiation region of the laser beam onto the workpiece is shifted by one of the galvano-mirrors in one axis direction while the irradiation region of the laser beam onto the workpiece is shifted by other one of the galvano-mirrors in the direction which is orthogonal to the one axis direction.

In the laser drilling apparatus according to the above-mentioned other aspect, a masking mechanism is preferably arranged in an optical path between the laser oscillator and the mask to avoid the irradiation of the laser beam during shifting the irradiation region of the laser beam.

BEST MODE FOR CARRYING OUT THE INVENTION

Figure 1:
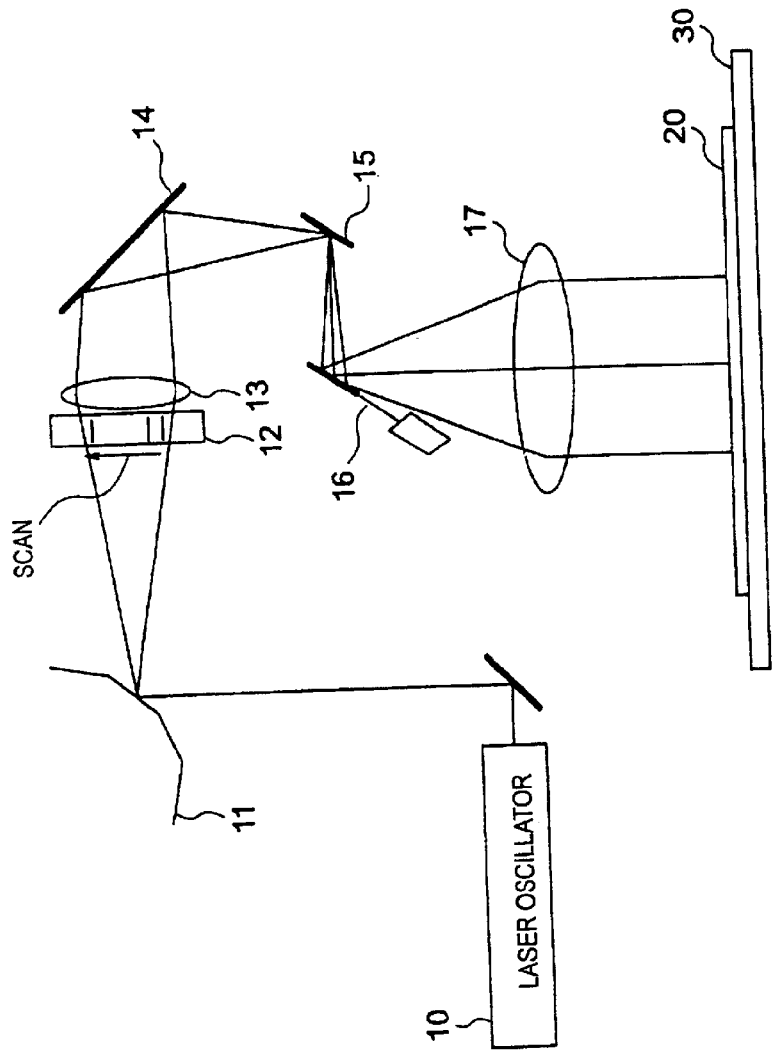
FIG. 1 is an illustration showing a configuration of a laser drilling apparatus according to a first embodiment of the present invention.
Figure 2:
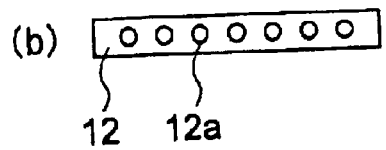
FIG. 2 shows examples of a cross-section of a laser beam and a mask pattern used in the apparatus shown in FIG. 1.
Figure 3:
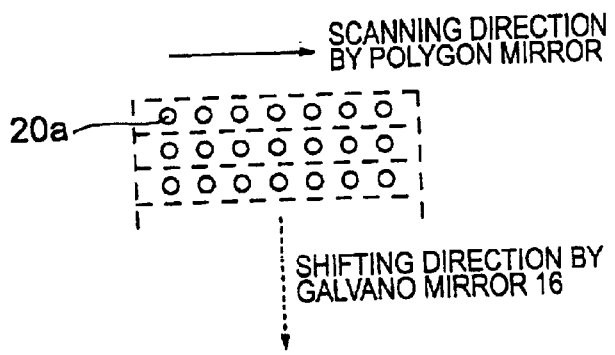
FIG. 3 is an illustration showing an example of a processing pattern formed by using the apparatus shown in FIG. 1.
Figure 4:
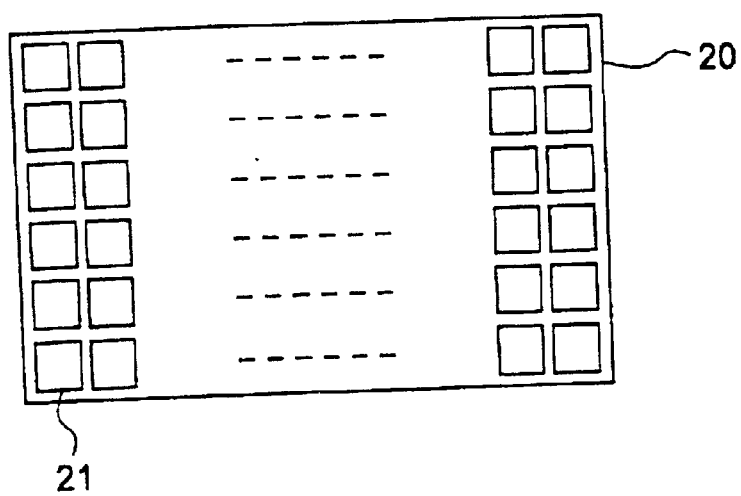
FIG. 4 is an illustration showing an example of a multiple printed circuit board to be processed by using the apparatus according to the present invention.

Referring to FIGS. 1 to 3, a laser drilling apparatus according to a first embodiment of the present invention will now be described. Here, the description will be made with respect to the case that the drilling is carried out to a resin layer of a printed circuit board. This apparatus includes a laser oscillator 10, a polygon mirror 11, a mask 12, an optical lens 13, reflective mirrors 14 and 15, a galvano-mirror 16, and a processing lens 17, arranged in that order. The processing lens 17 is also called an fθ lens. These are configured so that a laser beam from the laser oscillator 10 passes through the above components in that order and is incident on a workpiece, i.e., a printed circuit board 20.

The polygon mirror 11, as is well known, is a polyhedral reflecting mirror that has reflecting mirrors at sides of a regular polygon and can rotate around a central axis. The polygon mirror 11 can sweep the laser beam incident on one of the reflecting mirrors within a predetermined range at a high rate. As shown in FIG. 2(b), the mask 12 has, as a mask pattern, a plurality of holes 12a of an array shape that define a processing pattern for the printed circuit board 20. FIG. 2(a) shows a cross-sectional shape of the laser beam incident on the polygon mirror 11. The polygon mirror 11 sweeps the incident laser beam so that the laser beam scans these holes 12a of the mask 12 for each mirror. During this operation, the galvano-mirror 16 is stopped. As a result, a plurality of holes corresponding to the holes 12a of the mask 12 are collectively formed into the printed circuit board 20.

In cases such as drilling apparatuses with ultraviolet laser beams, since the laser beam produced by wavelength conversion of fundamental waves from YAG laser oscillators is used, the laser output becomes small. In such cases, holes are formed one by one.

FIG. 3 shows a processing pattern of the holes formed in the printed circuit board 20. A plurality of holes 20a are collectively formed in one irradiation region delimited by broken lines for each mirror of the polygon mirror 11.

As is well known, the galvano-mirror 16 is that the reflective mirror can be rotated by a rotary drive mechanism such as a motor. The galvano-mirror 16 can reflect the laser beam incident on the reflective mirror toward a desired position. In this embodiment, the galvano-mirror 16 is used for shifting the region irradiated with the laser beam (the processing region for every irradiation) on the printed circuit board 20 in one axis direction. Here, the galvano-mirror 16 is used for shifting the irradiation region in the direction orthogonal to the scanning direction (shown by a solid line in FIG. 3) by the polygon mirror 11.

The drilling operation will now be described. When the laser beam from the laser oscillator 10 is incident on one reflective mirror of the polygon mirror 11, the incident laser beam is swept by the rotation of the reflective mirror and thereby scans the mask 12. The laser beam traveling through each hole 12a of the mask 12 is continuously incident on a predetermined irradiation region of the printed circuit board 20 via the reflective mirrors 14 and 15, the galvano-mirror 16 that is a fixed condition, and the processing lens 17. As a result, a plurality of holes 20a having a predetermined shape and number defined by the holes 12a of the mask 12 are formed into the printed circuit board 20.

Next, the galvano-mirror 16 slightly rotates, the shift of the irradiation region of the laser beam is carried out. As a result, the laser beam incident on the subsequent reflective mirror of the polygon mirror 11 is swept as described above and scans the mask 12. The laser beam traveling through each hole 12a of the mask 12 is continuously incident on the subsequent irradiation region of the printed circuit board 20 via the reflective mirrors 14 and 15, the galvano-mirror 16 that is the fixed condition, and the processing lens 17. As a result, the plurality of holes 20a having the predetermined shape and the number defined by the holes 12a of the mask 12 are formed into a region adjacent to the precedent irradiation region on the printed circuit board 20. By this operation is repeated, plural rows of holes 20a, each row having the number defined by the holes 12a of the mask 12, are continuously formed into the printed circuit board 20.

The above-mentioned operation is based on a case in which the laser oscillator 10 continuously generates the laser beam. In some cases, the required drilling for the printed circuit board 20 may not be completed by a single irradiation of the laser beam depending on the thickness of the resin layer of the printed circuit board 20. In these cases, a predetermined number of irradiations of the laser beam are repeated for the same irradiation region. This is realized by that the galvano-mirror 16 is presented at a fixed condition until the scanning operation of the mask 12 by the polygon mirror 11 is repeated by the number of the reflective mirrors (of the polygon mirror 11) which is equal to the above-mentioned predetermined number. On the other hand, when the laser oscillator 10 generates a pulsed laser beam, a generation period for the pulsed laser beam is controlled so as to coincide with a scanning period for each hole 12a in the mask 12. By setting a rotation period of the galvano-mirror 16 as same with the above description, one hole is irradiated with a plurality of pulsed laser beams. Such an operation can be applied to the subsequent second to fourth embodiments.

The scanning rate of the laser beam by the polygon mirror 11 is significantly higher than the scanning rate of the galvano-mirror 16. Therefore, the drilling rate of this apparatus is significantly higher than the drilling rate for every hole using the X-Y scanner or galvano-scanner. As described before, since the galvano-mirror has a following response of about 500 Hz only, if the holes are formed one by one, the limit formation rate is about 500 holes per second. In contrast, since the scanning rate by the polygon mirror is significantly high, the oscillation frequency of the laser oscillator 10 determines the limit of the processing rate. If the oscillation frequency of the laser oscillator 10 is 2 kHz, it will be possible to achieve a processing rate of about 2,000 holes per second. In this case, for example, supposing that 2,500 holes with a diameter of 50 μm are formed on a square package substrate with a side length of 10 mm at a pitch of 0.2 mm, the processing time is about 2,500/2,000=1.25 seconds.

In addition, since the size of the processing lens 17 is limited, the region in which holes can be formed according to the above operation in the printed circuit board 20 is limited. In general, this region is a square with a side of several centimeters. In contrast, the drilling according to this embodiment is performed for each processing region of a multiple printed circuit board 20 that is divided into a plurality of processing regions 21. Although the drilling process is performed for one processing region 21 according to the above operation, if the printed circuit board 20 is no moved, the drilling for the subsequent region can not be performed. For the reason, the printed circuit board 20 is placed on a table 30 (FIG. 1) which is driven by a drive mechanism called an X-Y stage mechanism and which is movable in X and Y axes. The table 30 has a chucking mechanism for the printed circuit board 20. After the drilling for one processing region 21, the table 30 moves the subsequent processing region beneath the processing lens 17. Such a control is performed with a controller not shown in the drawing. Since the X-Y stage mechanism, the table, and the controller are well known, further description thereof is omitted.

Figure 5:
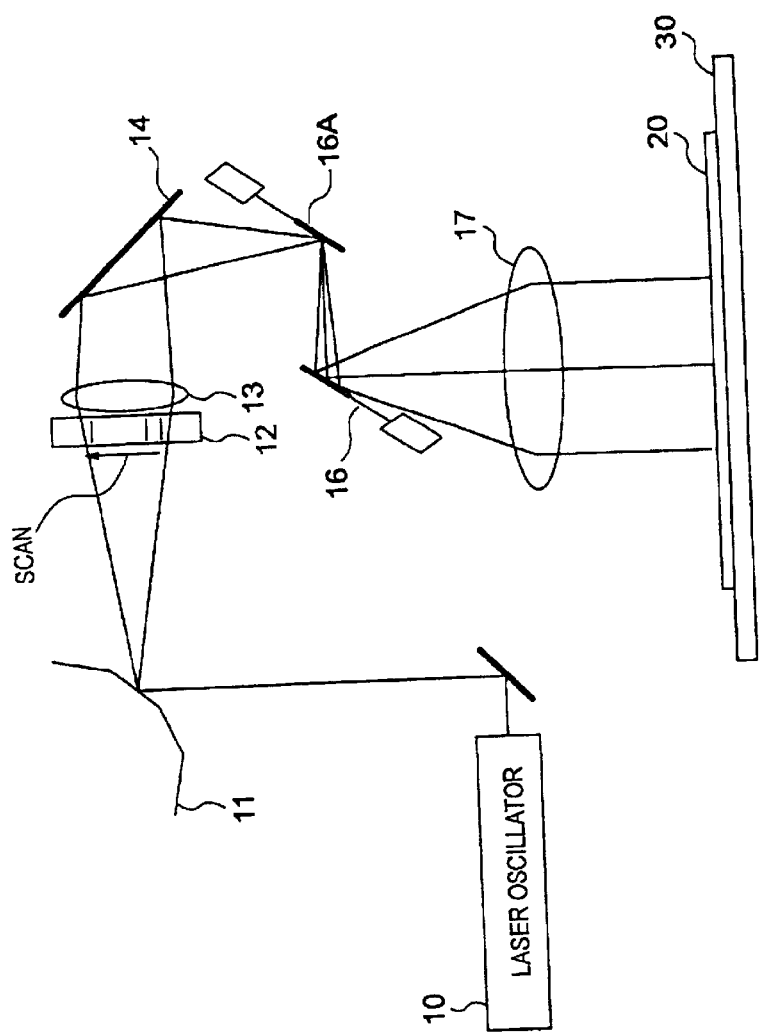
FIG. 5 is an illustration showing a configuration of a laser drilling apparatus according to a second embodiment of the present invention.
Figure 6:
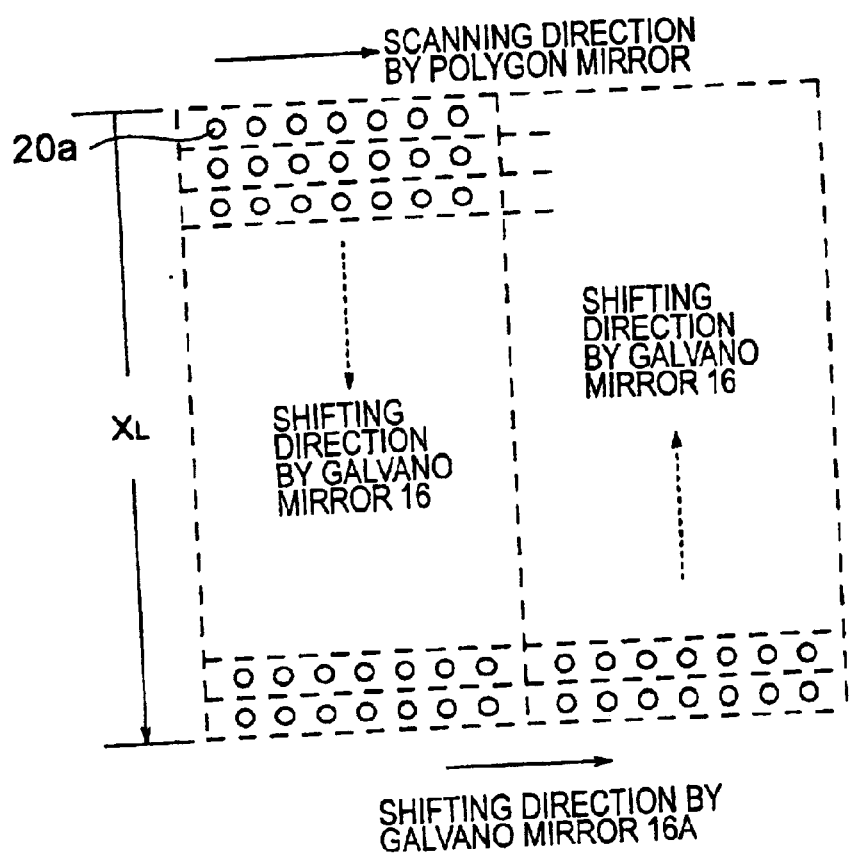
FIG. 6 is an illustration showing an example of a processing pattern formed by using the apparatus shown in FIG. 5.

With reference to FIGS. 5 and 6, a laser drilling apparatus according to a second embodiment of the present invention will now be described. Here, the description will be made with respect the case that the drilling is performed to the resin layer of the printed circuit board. This apparatus is that the reflective mirror 15 shown in FIG. 1 is substituted by a galvano-mirror 16A, and that the other configurations are the same as those in the embodiment shown in FIG. 1. As described before, the galvano-mirror 16 is used to shift the region irradiated with the laser beam on the printed circuit board 20 in one axis direction (hereinafter, this will be called as X-axis direction). On the other hand, the galvano-mirror 16A is used to shift the region irradiated with the laser beam on the printed circuit board 20 in the direction (hereinafter, this will be called as Y-axis direction) orthogonal to the above-mentioned X-axis direction.

The drilling will now be described. When the laser beam from the laser oscillator 10 is incident on one reflective mirror of the polygon mirror 11, the laser beam is swept by the rotation of the reflective mirror and scans the mask 12. The laser beam traveling through each hole 12a of the mask 12 is continuously incident on a predetermined region of the printed circuit board 20 via the reflective mirrors 14 and 15 and the galvano-mirrors 16A and 16 which are presented at a fixed condition. As a result, a plurality of holes 20a having a predetermined shape and number defined by the holes 12a of the mask 12 are formed into the printed circuit board 20.

Next, the galvano-mirror 16 slightly rotates, the shift of the irradiation region of the laser beam is carried out in the X-axis direction. As a result, the laser beam incident on the subsequent reflective mirror of the polygon mirror 11 is swept as described above and scans the mask 12. The laser beam traveling through each hole 12a of the mask 12 is continuously incident on the subsequent irradiation region of the printed circuit board 20 via the reflective mirrors 14 and 15, the galvano-mirrors 16A and 16, and the processing lens 17. As a result, the plurality of holes 20a having the predetermined shape and the number defined by the holes 12a of the mask 12 are formed into the region adjacent to the preceding irradiation region on the printed circuit board 20. By this operation is repeated, plural rows of holes 20a, each row being defined by the holes 12a of the mask 12, are continuously formed into the printed circuit board 20 in the X-axis direction as shown in FIG. 6. The range XL of the processing region in the X-axis direction is determined by the size of the processing lens 17.

Next, the galvano-mirror 16A slightly rotater, the irradiation region of the laser beam is shifted in the Y-axis direction. The shifting distance corresponds to the size of the irradiation region of the laser beam in the longitudinal direction. After this, although the operation similar to the above is repeated, the shot direction of the irradiation region of the laser beam by the galvano-mirror 16 is a direction opposite to that in the above operation. This means that the galvano-mirror 16 rotates in a direction opposite to that in the above operation, namely, the galvano-mirror 16 rotates so that the position rotated by a given angle returns to the original position. Of course, the range of the processing region in the Y-axis direction is also determined by the size of the processing lens 17.

As described above, by providing the galvano-mirror 16A for the shift in the Y-axis direction, as shown in FIG. 6, plural rows of holes, each having a plurality of holes 20a defined by the holes 12a of the mask 12, are continuously formed in a plurality of regions adjacent to each other.

Figure 7:
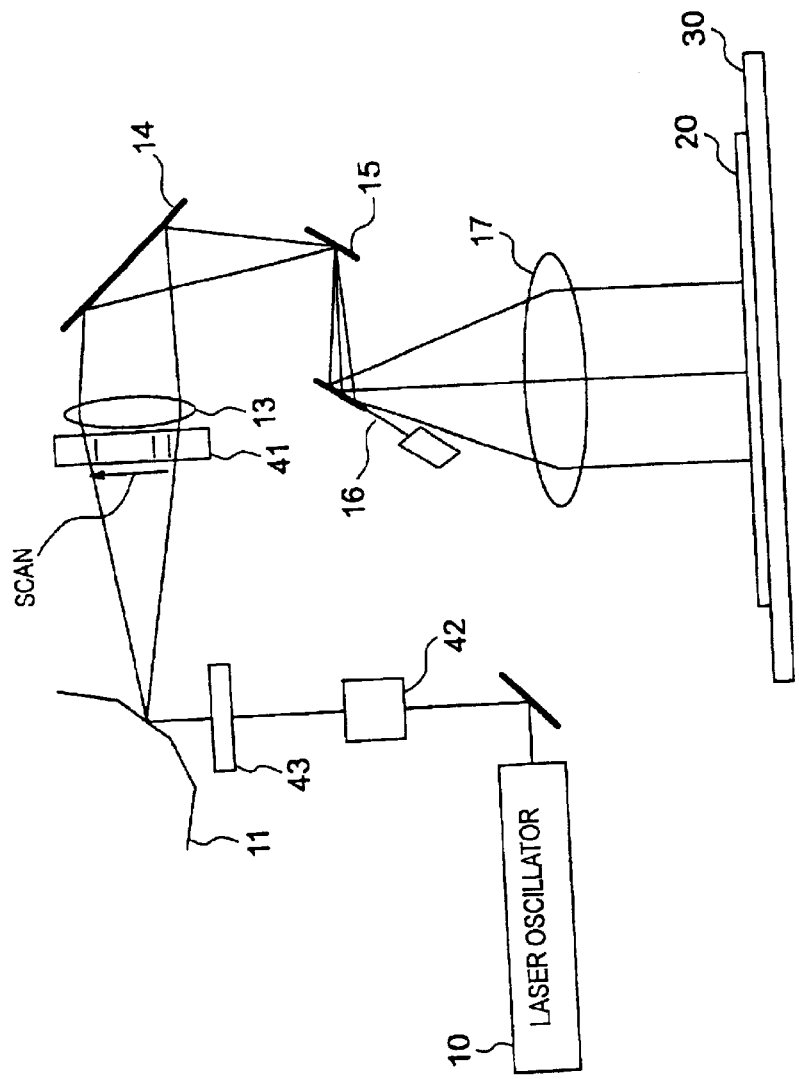
FIG. 7 is an illustration showing a configuration of a laser drilling apparatus according to a third embodiment of the present invention.
Figure 8:
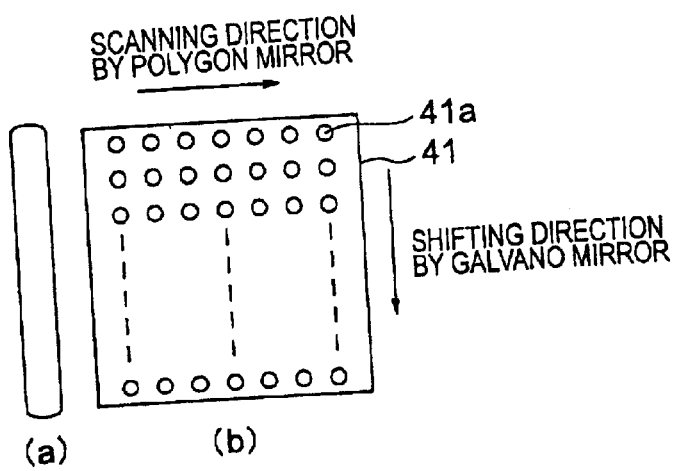
FIG. 8 shows examples of a cross-section of a laser beam and a mask pattern used in the apparatus shown in FIG. 7.

With reference to FIGS. 7 and 8, a laser drilling apparatus according to a third embodiment of the present invention will now be described. Here, the description will be made with respect to the case that the drilling for the resin layer of the printed circuit board is performed. This apparatus is that the mask 12 shown in FIG. 1 is substituted by another mask 41, and that a shaping optical system 42 and a masking mechanism 43 are arranged on the optical path between the laser oscillator 10 and the polygon mirror 11, the other configurations are the same as those in the embodiment shown in FIG. 1.

As shown in FIG. 8(b), the mask 41 has a mask pattern in which many holes 41a having the same shape are formed into a matrix with a constant pitch in a square area. However, this is merely one example and is not limited by such a pattern. The shaping optical system 42, as described later, is for changing the cross-section of the laser beam from the laser oscillator 10 into a linear or rectangular shape. The masking mechanism 43 is for turning the laser beam from the shaping optical system 42 to another path and will be described later.

Figure 10:
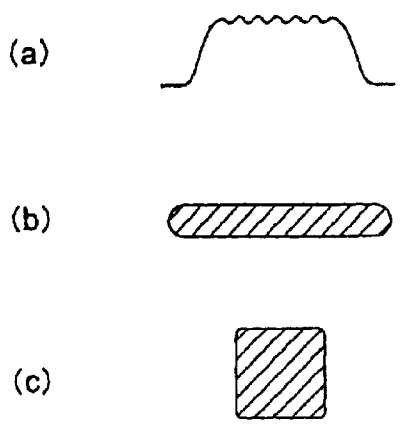
FIG. 10 shows a beam profile of a laser beam used in the present invention and cross-sectional shapes of the laser beam through a shaping optical system shown in FIG. 7.

Referring to FIG. 10, the laser beam from the laser oscillator 10 has, for example, a beam profile shown in FIG. 10(a). The beam profile represents a trapezoidal waveform in which a constant energy continues when viewed about a cross-section of the laser beam. In this case, by using a cylindrical lens as the shaping optical system 42, the laser beam having the beam profile and a circular cross-section can be shaped into a linear laser beam having a linear cross-section shown in FIG. 10(b). By the cylindrical lens, it is possible to form the linear laser beam with a width of one-tenth to several mm and a length of several cm. On the other hand, when a fly-eye lens is used instead of the cylindrical lens, the laser beam having the circular cross-section can be shaped into a rectangular laser beam having a rectangular cross-section as shown in FIG. 10(c). In this case, a side length of the beam cross-section is about several mm.

FIG. 8(a) shows the cross-sectional shape of the laser beam shaped into the linear shape. The size in the longitudinal direction of the laser beam is made somewhat larger than the longitudinal size of the mask 41 shown in FIG. 8(b). The description will be made in the case that the drilling is performed by using the linear laser beam (FIG. 10(b)).

The polygon mirror 11 sweeps the linear laser beam so as to scan across the entire mask pattern having plural rows of holes 41a of the mask 41 for the mirror on every face of the polygon mirror 11. During this operation, the galvano-mirror 16 is stopped. As a result, a plurality of holes having plural rows defined by the mask pattern of the mask 41 are collectively formed into an irradiation region of the printed circuit board 20, shown by broken lines in FIG. 9.

The galvano-mirror 16 is to shift the irradiation region of the laser beam to the printed circuit board 20 in one axis direction. The shifting distance is larger than the longitudinal size of one irradiation region in the printed circuit board 20.

The drilling will now be described. When the linear laser beam from the shaping optical system 42 is incident on one reflective mirror of the polygon mirror 11, the incident laser beam is swept by the rotation of the reflective mirror and scans the entire surface of the mask 41. The laser beam traveling through each hole 41a of the mask 41 is continuously incident on a predetermined irradiation region of the printed circuit board 20 via the reflective mirrors 14 and 15, the galvano-mirror 16 that is presented at a fixed condition, and the processing lens 17. As a result, a plurality of holes 20a defined by the mask pattern of the mask 41 are collectively formed into the printed circuit board 20.

Figure 9:
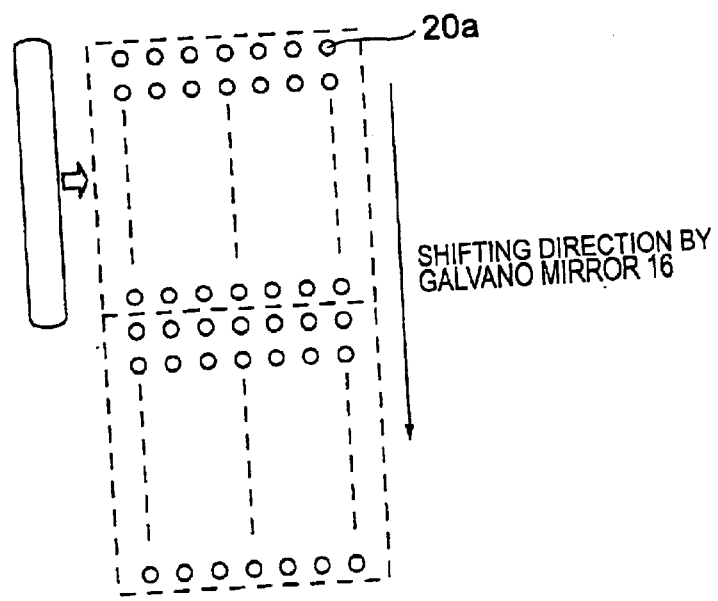
FIG. 9 is an illustration showing an example of a processing pattern formed by using the apparatus shown in FIG. 7.

Next, the galvano-mirror 16 slightly rotates, the shift of the irradiation region of the laser beam is performed. As a result, the laser beam incident on the subsequent reflective mirror of the polygon mirror 11 is swept as described above and scans the entire surface of the mask 41. The laser beam traveling through each hole 41a of the mask 41 is continuously incident on the subsequent irradiation region of the printed circuit board 20 via the reflective mirrors 14 and 15, the galvano-mirror 16 that is presented at a fixed condition, and the processing lens 17. As a result, the plurality of holes 20a defined by the mask pattern of the mask 41 are formed in a region adjacent to the precedent irradiation region on the printed circuit board 20. By this operation is repeated, plural rows of holes 20a defined by the mask pattern of the mask 41 are continuously formed onto the printed circuit board 20 as shown in FIG. 9.

Next, the drilling will be described in the case that a rectangular laser beam is used instead of the linear laser beam. In the laser drilling apparatus in such a case, since the rectangular laser beam has a cross-section having a side of several mm, the size of the mask is also reduced in correspondence to this.

For example, supposing that the processing region 21 is a square with a side of 10 mm and that the cross-section of the rectangular laser beam is a square with a side of 5 mm. In this case, as shown in FIG. 11(a), the size of a mask 41' is made at 5 mm×10 mm. On the other hand, as shown in FIG. 11(b), the processing region 21 is equally divided into two regions 21-1 and 21-2. First, the region 21-1 is irradiated with the rectangular laser beam and subsequently the drilling of the number determined by the mask pattern of the mask 41' is performed. Next, the irradiation region of the rectangular laser beam is shifted in one axis direction by the galvano-mirror 16 and the drilling for the region 21-2 is performed.

In addition, a reduced number of holes are depicted in the mask patterns shown in FIGS. 2(b) and 8(b); however, in an actual mask, many microholes are formed at a narrower pitch.

Figure 11:
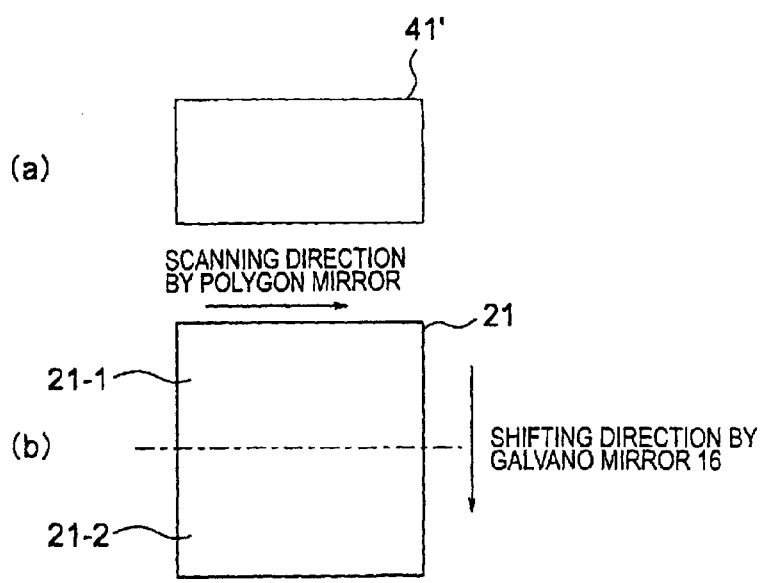
FIG. 11 is illustrations for describing a method in the case that the process is carried out with a rectangular laser beam in the apparatus shown in FIG. 7 in which a processing region is divided into four regions.

By the way, in the third embodiment, the shift of the irradiation region by the galvano-mirror 16 shown in FIG. 9 and FIG. 11 requires a certain time, although the certain time is significantly short. During the shift, the laser oscillator 10 continues the oscillation. Therefore, if the laser beam generated during the above-mentioned shift is incident on the polygon mirror 11, a plurality of holes may be formed in an undesired region on the printed circuit board 20 through the mask pattern of the mask 41 or 41'.

The masking mechanism 43 is for preventing the above-mentioned problem. The masking mechanism 43 serves so as to turn the laser beam from the shaping optical system 42 from an incident path of the polygon mirror 11 to another path during the above-mentioned shift. A simple example of the masking mechanism 43 is realized by a combination of a rotatable reflective mirror and a target member. In a normal state, the rotatable reflective mirror serves so that the laser beam from the shaping optical system 42 is incident on the polygon mirror 11. On the other hand, during the above-mentioned shift, by slightly rotating the rotatable reflective mirror, the laser beam from the shaping optical system 42 is incident on the target member. This type of control is performed by the controller not shown in the drawing. In addition, the target member must be combined with a cooling section by water-cooling or the like to suppress heating by the incident laser beam. Such a masking mechanism also must be placed in the first and second embodiments described in FIGS. 1 and 5, respectively, if the shifting time can not be disregarded.

Figure 12:
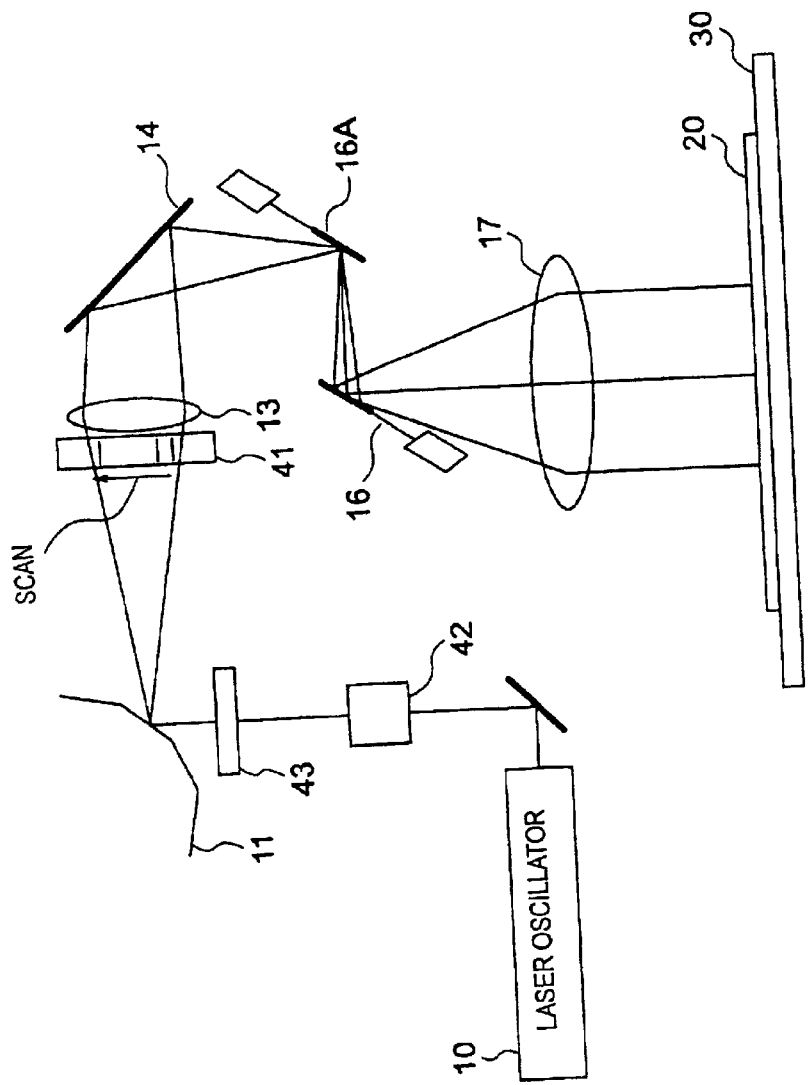
FIG. 12 is an illustration showing a configuration of a laser drilling apparatus according to a fourth embodiment of the present invention.
Figure 13:
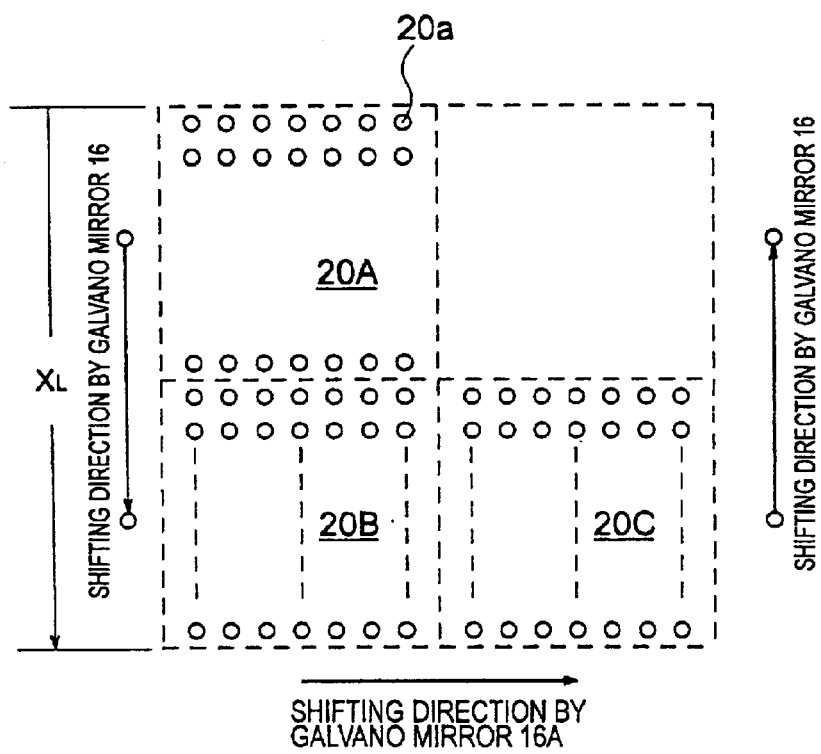
FIG. 13 is an illustration showing an example of a processing pattern formed by using the apparatus shown in FIG. 12.

With reference to FIGS. 12 and 13, a laser drilling apparatus according to a fourth embodiment will now be described. Here, the description will be made with respect to the drilling for a resin layer of a printed circuit board. This apparatus substitutes a galvano-mirror 16A for the reflective mirror 15 shown in FIG. 7, and the other configurations are the same as those in the embodiment shown in FIG. 7. As described before, the galvano-mirror 16 is used to shift the irradiation region of the laser beam onto the printed circuit board 20 in the X-axis direction. On the other hand, the galvano-mirror 16A is used to shift the irradiation region of the laser beam onto the printed circuit board 20 in the Y-axis direction.

The drilling by the linear laser beam will now be described. When the linear laser beam from the shaping optical system 42 is incident on one reflective mirror of the polygon mirror 11, the incident laser beam is swept by the rotation of the reflective mirror and scans the entire surface of the mask 41. The laser beam traveling through each hole 41a of the mask 41 is continuously incident on a predetermined irradiation region 20A of the printed circuit board 20 via the reflective mirrors 14 and 15, the galvano-mirror 16 that is presented at a fixed condition, and the processing lens 17. As a result, a plurality of holes 20a defined by the mask pattern of the mask 41 are collectively formed into the printed circuit board 20.

Next, the galvano-mirror 16 slightly rotates, the shift of the irradiation region of the laser beam is performed. As a result, the laser beam incident on the subsequent reflective mirror of the polygon mirror 11 is swept as described above and scans the entire surface of the mask 12. The laser beam traveling through each hole 41a of the mask 41 is continuously incident on a subsequent irradiation region 20B of the printed circuit board 20 via the reflective mirrors 14 and 15, the galvano-mirror 16, and the processing lens 17. As a result, the plurality of holes 20a defined by the mask pattern of the mask 41 is formed in the region 20B adjacent to the precedent irradiation region 20A on the printed circuit board 20. The range XL in the X-axis direction of the processing region is determined by the size of the processing lens 17.

Next, the galvano-mirror 16A slightly rotates, the irradiation region of the laser beam is shifted in the Y-axis direction. The shifting distance corresponds to the size of the irradiation region of the laser beam in the width direction. An operation similar to the above is repeated, but the shift direction of the irradiation region of the laser beam by the galvano-mirror 16 is opposite to that in the above operation. This means that the galvano-mirror 16 rotates in a direction opposite to that in the above operation, in other words, the galvano-mirror 16 rotates so that the position rotated by a given angle returns to the original position. Of course, the range in the Y-axis direction of the processing region is also determined by the size of the processing lens 17.

As described above, by providing the galvano-mirror 16A for the shift in the Y-axis direction, as shown in FIG. 13, plural rows of holes 20a defined by the mask pattern of the mask 41 are continuously formed in a plurality of regions adjacent to each other.

In the fourth embodiment, when the drilling is performed by using the rectangular laser beam, the drilling for each irradiation region 20A, 20B, and 20C is performed by the method similar to that shown in FIG. 11. The masking mechanism 43 operates as the same operation described in the third embodiment.

The present invention has been described above according to the few embodiments, but is not limited to these embodiments. The laser oscillator 10 may be implemented by a YAG laser oscillator, a $CO_2$ laser oscillator, the second harmonic ($2\omega$), third harmonic ($3\omega$), and fourth harmonic ($4\omega$) thereof, and an excimer laser oscillator. The workpiece for drilling is not limited to a resinous material such as a printed circuit board and may be a substrate material such as a ceramic.

The present invention, as described above, provides the laser drilling method and the laser drilling apparatus, which can form many holes within a short time compared with known laser drilling apparatuses.

Industrial Applicability

As described above, the laser drilling method or the laser drilling apparatus according to the present invention is suitable for drilling of printed circuit boards and materials such as ceramic thin plates used as insulating materials in electronic components, for example, capacitors and piezoelectric elements.

What is claimed is:

1. A laser drilling method for carrying out drilling by irradiating a workpiece with a laser beam from a laser oscillator, wherein said laser beam is projected traveling through a polygon mirror, a mask having a mask pattern including a plurality of holes for defining a processing pattern, at least one galvano-mirror, and a processing lens, said polygon mirror sweeps said laser beam so that said laser beam scans across the plurality of holes in said mask to thereby forming a plurality of holes into said workpiece, and an irradiation region of said laser beam onto said workpiece is shifted in one axis direction by said at least one galvano-mirror.

2. The laser drilling method according to claim 1, wherein two galvano-mirrors are provided, and the irradiation region of said laser beam onto said workpiece is shifted by one of the galvano-mirrors in one axis direction while the irradiation region of the laser beam onto said workpiece is shifted by other one of the galvano-mirrors in the direction which is orthogonal to said one axis direction.

3. A laser drilling method for carrying out drilling by irradiating a workpiece with a laser beam from a laser oscillator, wherein said laser beam is projected traveling through a shaping optical system for shaping the laser beam into a line or rectangle, a polygon mirror, a mask having a mask pattern including a plurality of holes for defining a processing pattern, at least one galvano-mirror, and a processing lens, said polygon mirror sweeps said laser beam so that the laser beam scans across the plurality of holes in said mask to thereby collectively forming a plurality of holes into said workpiece, and an irradiation region of said laser beam is shifted in one axis direction by said at least one galvano-mirror.

4. The laser drilling method according to claim 3, wherein two galvano-mirrors are provided, and the irradiation region of said laser beam onto said workpiece is shifted by one of the galvano-mirrors in one axis direction while the irradiation region of said laser beam onto said workpiece is shifted by other one of the galvano-mirrors in the direction which is orthogonal to said one axis direction.

5. The laser drilling method according to either claim 3 or 4, wherein, by arranging a masking mechanism in an optical path between said laser oscillator and said mask, the irradiation of said laser beam is avoided during shifting the irradiation region of said laser beam.

6. A laser drilling apparatus for carrying out drilling by irradiating a workpiece with a laser beam from a laser oscillator, wherein:

a polygon mirror, a mask having a mask pattern including a plurality of holes for defining a processing pattern, at least one galvano-mirror, and a processing lens are arranged between said laser oscillator and said workplace, the laser beam from said laser oscillator being projected onto said workpiece traveling through these components, said polygon mirror sweeps said laser beam so that the laser beam scans across the plurality of holes in said mask to thereby forming a plurality of holes into said workpiece, and an irradiation region of said laser beam is shifted in one axis direction by said at least one galvano-mirror.

7. The laser drilling apparatus according to claim 6, wherein two galvano-mirrors are provided, and the irradiation region of said laser beam onto said workpiece is shifted by one of the galvano-mirrors in one axis direction while the irradiation region of said laser beam onto said workpiece is shifted by other one of the galvano-mirrors in the direction which is orthogonal to said one axis direction.

8. A laser drilling apparatus for carrying out drilling by irradiating a workpiece with a laser beam from a laser oscillator, wherein:

a shaping optical system for shaping said laser beam into a line or rectangle, a polygon mirror, a mask having a mask pattern including a plurality of holes for defining a processing pattern, at least one galvano-mirror, and a processing lens are arranged between said laser oscillator and said workpiece, the laser beam from said laser oscillator being projected onto said workpiece traveling through these components, said polygon mirror sweeps said laser beam so that the laser beam scans across the plurality of holes in said mask to thereby collectively forming a plurality of holes into said workpiece, and an irradiation region of said laser beam is shifted in one axis direction by said at least one galvano-mirror.

9. The laser drilling apparatus according to claim 8, wherein two galvano-mirrors are provided, and the irradiation region of said laser beam onto said workpiece is shifted by one of the galvano-mirrors in one axis direction while the irradiation region of said laser beam onto said workplace is shifted by other one of the galvano-mirrors in the direction which is orthogonal to said one axis direction.

10. The laser drilling apparatus according to either claim 8 or 9, wherein a masking mechanism is arranged in an optical path between said laser oscillator and said mask to avoid the irradiation of said laser beam during shifting the irradiation region of said laser beam.

* * * * *

UNITED STATES PATENT AND TRADEMARK OFFICE
CERTIFICATE OF CORRECTION

PATENT NO. : 6,720,524 B1
APPLICATION NO. : 10/089063
DATED : April 13, 2004
INVENTOR(S) : Shiro Hamada It is certified that error appears in the above-identified patent and that said Letters Patent is hereby corrected as shown below:

Item [54], title, and column 1, line 1: should read

--LASER DRILLING METHOD AND DRILLING APPARATUS--

Signed and Sealed this

Twenty-second Day of January, 2008

JON W. DUDAS
*Director of the United States Patent and Trademark Office*